(12) United States Patent
Saxena

(10) Patent No.: US 9,467,154 B2
(45) Date of Patent: Oct. 11, 2016

(54) LOW POWER AND INTEGRABLE ON-CHIP ARCHITECTURE FOR LOW FREQUENCY PLL

(71) Applicant: Microchip Technology Incorporated, Chandler, AZ (US)

(72) Inventor: Himanshu Saxena, Rajasthan (IN)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/594,447

(22) Filed: Jan. 12, 2015

(65) Prior Publication Data
US 2016/0204785 A1    Jul. 14, 2016

(51) Int. Cl.
| H03L 7/06 | (2006.01) |
|---|---|
| H03L 7/093 | (2006.01) |
| H03L 7/095 | (2006.01) |
| H02M 3/07 | (2006.01) |

(52) U.S. Cl.
CPC ............... *H03L 7/093* (2013.01); *H02M 3/07* (2013.01); *H03L 7/095* (2013.01)

(58) Field of Classification Search
USPC .................................. 327/147–149, 156–158
See application file for complete search history.

(56) References Cited

U.S. PATENT DOCUMENTS

| 5,337,284 A * | 8/1994 | Cordoba | G05F 1/465 327/540 |
|---|---|---|---|
| 5,978,283 A * | 11/1999 | Hsu | G11C 5/145 327/536 |
| 7,535,272 B1 * | 5/2009 | Kwong | H03L 7/081 327/156 |
| 2003/0137328 A1 * | 7/2003 | Kurd | H03L 7/0893 327/156 |
| 2006/0017476 A1 | 1/2006 | Jung et al. | 327/156 |
| 2006/0119404 A1 | 6/2006 | Yeh | 327/157 |
| 2008/0042703 A1 * | 2/2008 | Sha | H03L 7/0812 327/158 |
| 2010/0007408 A1 * | 1/2010 | Yamahira | G11C 5/143 327/541 |
| 2011/0248787 A1 * | 10/2011 | Jiang | H03J 3/20 331/117 FE |
| 2012/0049936 A1 * | 3/2012 | Adkins | H02M 3/07 327/536 |
| 2012/0098570 A1 | 4/2012 | Wang et al. | 327/7 |
| 2013/0187690 A1 | 7/2013 | Feng et al. | 327/157 |
| 2014/0062550 A1 * | 3/2014 | Lee | H03L 7/0893 327/157 |
| 2014/0203842 A1 * | 7/2014 | Maruko | H03K 3/35625 327/12 |
| 2014/0218082 A1 * | 8/2014 | Fan | H03H 19/004 327/157 |
| 2014/0240371 A1 * | 8/2014 | Oh | G09G 5/02 345/690 |
| 2016/0006442 A1 * | 1/2016 | Lahiri | H03L 7/089 327/157 |

FOREIGN PATENT DOCUMENTS

EP    1471645 A1    10/2004    ............. H03H 11/04

OTHER PUBLICATIONS

International Search Report and Written Opinion, Application No. PCT/US2016/013018, 12 pages, Jun. 8, 2016.

* cited by examiner

*Primary Examiner* — Adam Houston
(74) *Attorney, Agent, or Firm* — Slayden Grubert Beard PLLC

(57) ABSTRACT

An integrated circuit including a phase detector; a first charge pump and a second charge pump coupled to the phase detector, and configured to receive inputs from the phase detector, the first charge pump outputting a low current and the second charge pump outputting a high current; and a dual input loop filter coupled to the first charge pump and the second charge pump.

20 Claims, 5 Drawing Sheets

LOW POWER AND INTEGRABLE ON-CHIP ARCHITECTURE FOR LOW FREQUENCY PLL

TECHNICAL FIELD

The present disclosure relates to methods and systems for phase-locked loops (PLLs) and, in particular, to a low frequency on-chip phase-locked loop.

BACKGROUND

Phase-locked loops are integral components of clock generation circuits. A phase-locked loop (PLL) circuit is a feedback system that generates an output signal whose phase is constant relative to the phase of an input reference signal. In addition to synchronizing signals, a phase-locked loop can generate a frequency that is a multiple of the input frequency.

For example, shown in FIG. 1 is a typical PLL circuit 100. The PLL 100 includes a phase detector (PFD) 102, charge pump 104, loop filter 106, and VCO 108. The phase detector 102 compares the input signal and a feedback signal. The PFD 102 detects the difference in phase and frequency between the reference signal ref(t) and a feedback signal div(t) and generates an up(t) or down(t) control signal based on whether the feedback frequency is lagging or leading the reference frequency. These "up" or "down" control signals determine whether the VCO 108 needs to operate at a higher or lower frequency, respectively.

The PFD 102 outputs these "up" and "down" signals to the charge pump 104. If the charge pump 104 receives an up signal, current is driven into the loop filter 106. Conversely, if it receives a down signal, current is drawn from the loop filter 106.

The loop filter 106 converts these signals to a control voltage Vtune(t) that is used to bias the VCO 108. Based on the control voltage, the VCO 108 oscillates at a higher or lower frequency, which affects the phase and frequency of the feedback clock. If the PFD 102 produces an up signal, then the VCO frequency increases. A down signal decreases the VCO frequency. The VCO 108 stabilizes once the reference clock and the feedback clock have the same phase and frequency. The loop filter 106 filters out jitter by removing glitches from the charge pump and preventing voltage over-shoot.

In some implementations, a frequency divider 110 is provided in the feedback path. Negative feedback forces the error signal output from the phase detector 102 to approach zero. At this point, the feedback divider output 110 and the reference frequency are in phase and frequency lock, i.e., aligned, the PLL is considered locked.

An on-chip implementation of a charge pump PLL is problematic, largely due to the loop filter. That is, the area occupied by the loop filter, and the power consumed by the loop filter, tends to be relatively large. Consequently, typical implementations of PLLs provide off-chip loop filters. For example, low frequency PLLs typically need an off-chip capacitor in the range of nF.

SUMMARY

According to various embodiments, an integrated circuit, is provided, including a phase detector; a first charge pump and a second charge pump coupled to the phase detector, and configured to receive inputs from the phase detector, the first charge pump outputting a low current and the second charge pump outputting a high current; and a dual input loop filter coupled to the first charge pump and the second charge pump.

In some embodiments, the dual input loop filter including a first capacitance coupled in parallel at a node with a series-coupled second capacitance and a resistor, the low current output of the first charge pump being provided at the node and the high current output of the second charge pump being provided between the second capacitance and the resistor. In some embodiments, the integrated circuit further comprises a common bias circuitry for charging the high current charge pump and the low current charge pump. In some embodiments, the integrated circuit comprises common bias circuitry for charging the first charge pump and second charge pump. In some embodiments, the charge pumps is a current steering amplifier charge pump which can be implemented using low current.

In some embodiments, the high current charge pump and the low current charge pump have synchronized outputs. In some embodiments, the capacitance Cz is approximately a tenth of the actual desired capacitance for stable negative feedback loop.

In some embodiments, the integrated circuit includes a voltage control oscillator (VCO) coupled to the dual input loop filter. In some embodiments, the low frequency VOC includes a bias block capable of generating current in nA. In some embodiments, the bias block implements a source degeneration for voltage to current transformation. In some embodiments, a resistor value for the source degeneration is scaled down by half factor. In some embodiments, a common mode voltage technique is used to scale down the value of the resistor. In some embodiments, the integrated circuit further comprises a current source branch which is a replica of existing bias circuitry.

A phase locked loop circuit, in accordance with embodiments includes a phase detector; a first charge pump and a second charge pump coupled to the phase detector, and configured to receive inputs from the phase detector, the first charge pump outputting a low current and the second charge pump outputting a high current; a dual input loop filter coupled to the first charge pump and the second charge pump; and a lock detector configured to continuously monitor an output of the phase locked loop circuit.

In some embodiments, the lock detector is configured to generate a lock signal depending upon phase error between a reference clock and a feedback clock signal. In some embodiments, the lock detector has a delay cell to predefine a lock/unlock window for the lock signal. In some embodiments, the delay cell includes a bias circuit and delay cell replica of an associated VCO such that a change in VCO frequency will be replicated in the delay cell of the lock detector circuit.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

Figure 2:
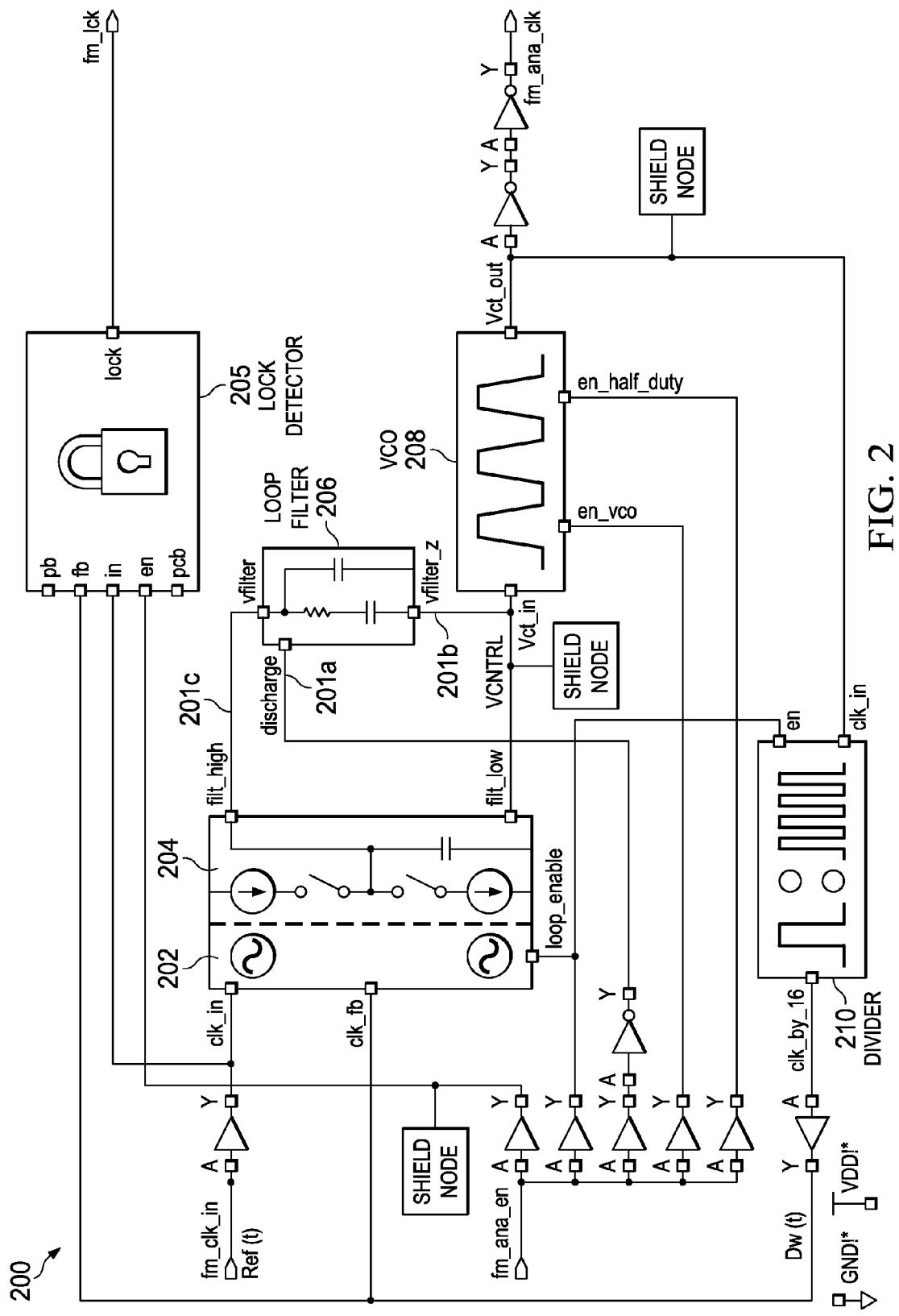
FIG. 2 depicts a diagrammatic representation of an exemplary phase-locked loop in accordance with embodiments.

Turning now to the drawings and with particular attention to FIG. 2, a diagram of an exemplary phase locked loop (PLL) 200 according to embodiments is shown. The PLL 200 includes a phase detector (PFD) 202, one or more charge pumps 204, loop filter 206, and VCO 208. In addition, the PLL 200 may include a lock detector 205 that outputs a signal when the PLL is locked on to the desire frequency.

The PFD 202 detects the difference in phase and frequency between the reference signal ref(t) and a feedback signal div(t) and generates an up(t) or down(t) control signal based on whether the feedback frequency is lagging or leading the reference frequency. These "up" or "down" control signals determine whether the VCO 208 needs to operate at a higher or lower frequency, respectively.

The PFD 202 outputs these "up" and "down" signals to the charge pump 204. In some embodiments, the charge pump 204 comprises two current steering amplifier charge pumps. One of these two charge pump is provided for sourcing and sinking high current and another is provided for sourcing and sinking low current. A common bias circuitry is employed to power up the two charge pumps. In some embodiments, the common bias circuitry powers up the two charge pump in a fixed ratio. That is, to have synchronized high and low current charge pumps, a common bias circuitry scales up and down the bias for the high and low charge pumps by a constant/fixed ratio. In some embodiments, the common bias circuitry will bias the high current charge pump by scaling up the bias by a 'y' factor and will bias the low current charge pump by scaling down the bias by the same 'y' factor.

When charge pump 204 receives an up signal, high and low current is driven into the loop filter 206 along the 'filt_hi' and 'filt_low' line-respectively. Conversely if it receives a low signal, high and low current is drawn out from 'filt_hi' and 'filt_low' line respectively. An example of common bias in accordance with embodiments is illustrated in more detail with respect to FIG. 4.

The loop filter 206 converts these signals to a control voltage Vcntrl that is used to bias the VCO 208. As will be discussed in greater detail below, in some embodiments, the loop filter 206 is a passive dual path loop filter with an on-chip capacitor.

Based on the control voltage, the VCO 208 oscillates at a higher or lower frequency, which affects the phase and frequency of the feedback clock. In the embodiment illustrated, a VCO 208 is provided with bias scheme. Usually low frequency VCO 208 needs low bias current in nA to have reasonable size delay cell to generate lower frequencies. An example of VCO circuitry in accordance with embodiment is illustrated in more details with respect to FIG. 5. If the PFD 202 produces an up signal, then the VCO frequency increases. A down signal decreases the VCO frequency. The VCO 208 stabilizes once the reference clock and the feedback clock have the same phase and frequency. The loop filter 206 filters out jitter by removing glitches from the charge pump and preventing voltage over-shoot.

In the embodiment illustrated, a frequency divider 210 is provided in the feedback path. Negative feedback forces the error signal output from the phase detector 202 to approach zero. At this point, the feedback divider output 210 and the reference frequency are in phase and frequency lock, i.e., aligned, the PLL is considered locked. In addition, a lock detector 205 may be provided to output an indication of when the PLL is locked. In the embodiment illustrated, a lock detector 205 is provided with a precise locking scheme across the desired output frequencies. In some embodiments, the delay circuit used in the lock detector is a replica of the bias and delay cell of VCO 208. The delay circuit will track the VCO frequency and ensure precise locking across the frequency range. A example of delay in accordance with embodiment is illustrated in more details with respect to FIG. 6.

As will be discussed in greater detail below, the loop filter 206 and the charge pump 204 may be configured to optimally reside on chip. As noted above, in some embodiments, the charge pump 204 comprises two current steering charge pumps which employ common bias circuitry to power up the charge pumps in a fixed ratio. In some embodiments, one of the charge pumps provides a HI current output 201c and one provides a LO current output 201b to the loop filter 206. Accordingly, the loop filter 206 may be implemented as a passive dual path loop filter, receiving Hi and Lo current from the charge pumps 204.

Figure 1:
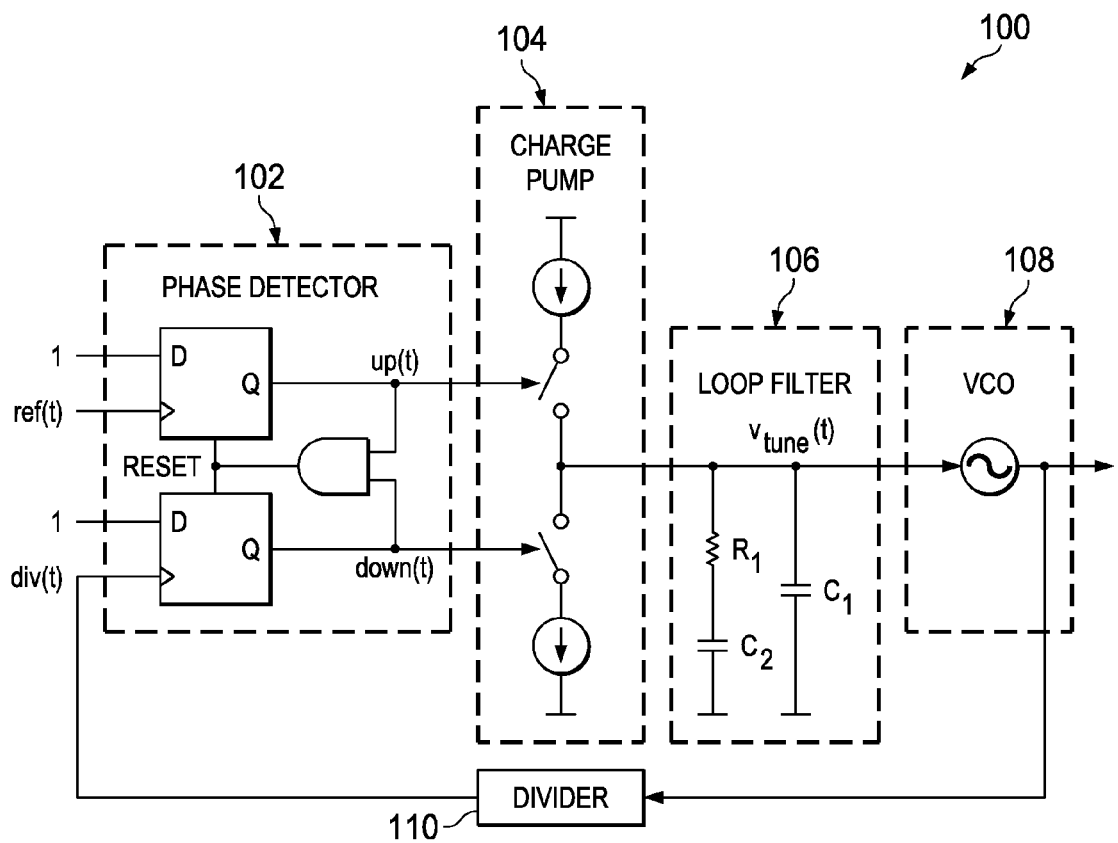
FIG. 1 depicts a diagrammatic representation of a phase-locked loop.
Figure 3:
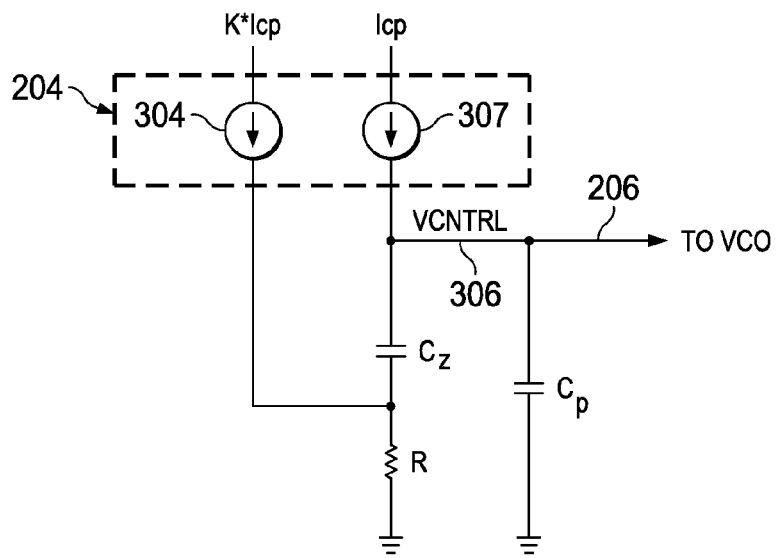
FIG. 3 illustrates an exemplary loop filter according to embodiments.

An example of a loop filter in accordance with embodiments is illustrated in more detail with respect to FIG. 3. The charge pump 204 is illustrated as current sources 302, 304. Charge pump 302 provides a current Icp, while charge pump 304 provides a current K*Icp, where K is a predetermined value. In a typical implementation, K may have a value of 10-20. In operation, the charge pumps are synchronized, such that when current on one is up, current on the other is, as well, and vice versa. Thus, charge pump 304 always provides a current that is K times the current from charge pump 302.

The loop filter 206 includes capacitors Cz and Cp and resistor R. As shown, resistor R is coupled between the capacitor Cz and ground, with the output of the current source 304 being provided between the resistor R and the capacitor Cz. The capacitor Cp is coupled between the output Vctrl 306 and ground and the output of the current source 302. The capacitor Cz is coupled between output Vctrl and the resistor R. Advantageously, in the configuration illustrated, pumping low and high current across the Cz capacitor, will virtually increase the capacitor value of Cz. In some embodiments, the capacitor Cz has a value around $1/10^{th}$ of the actual capacitor value required for stable close loop negative feedback.

Figure 4A:
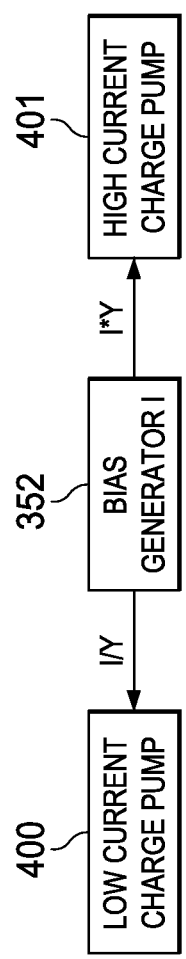
FIG. 4A illustrates an exemplary dual charge pump configuration in accordance with embodiments.

In some embodiments, the dual charge pump is biased with a single bias generator. For example, shown in FIG. 4A is a particular implementation of the low and high current charge pumps. For example, as shown, a bias generator 352 may be positioned between a low power charge pump 400 and a high power charge pump 401. As noted above, the low current charge pump 400 may generate a current of Icp and the high current charge pump may generate K*Icp. In a particular embodiment, the bias generator 352 may generate a current I, which is stepped down by a factor of Y to feed the low current charge pump 400 and scaled up by Y to feed the high current charge pump. In this way, synchronicity is maintained between the charge pumps. The bias generator 352 may comprise any suitable circuit for providing the desired bias voltage.

Figure 4B:
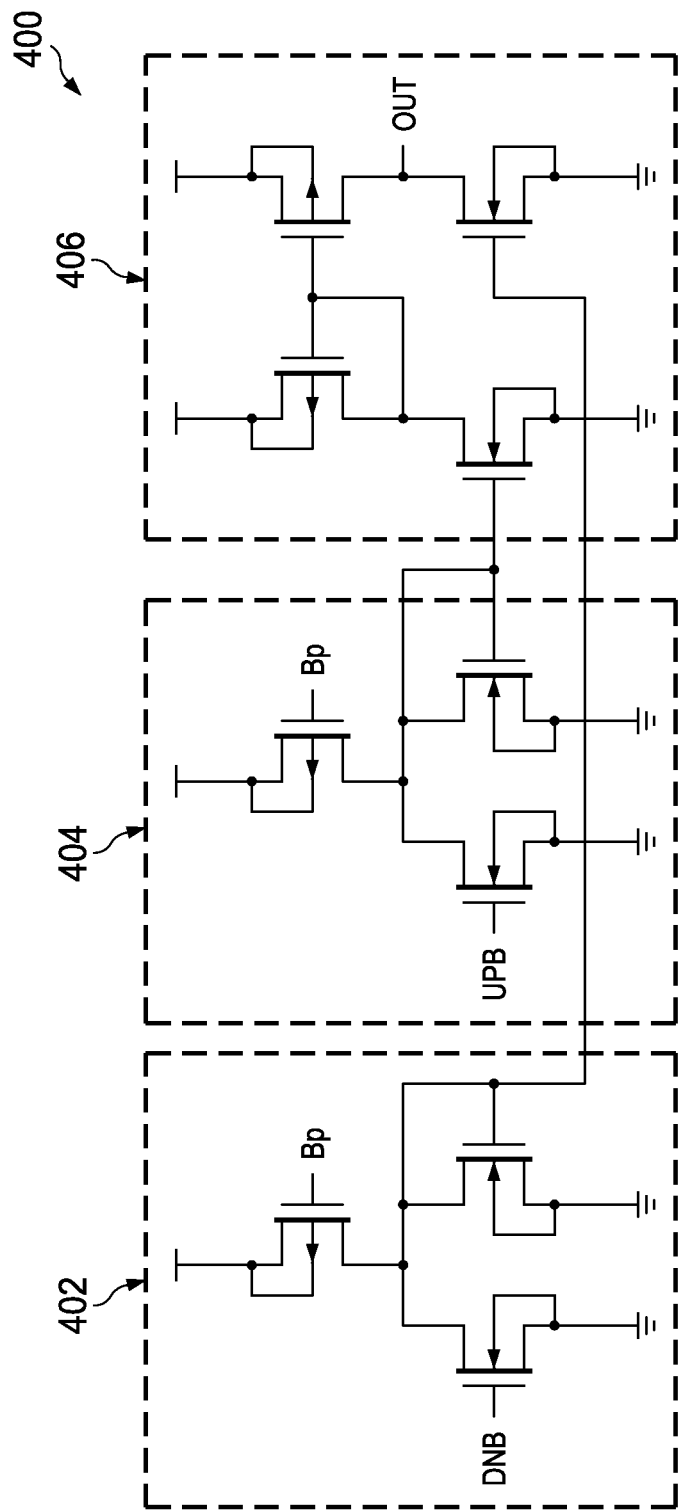
FIG. 4B illustrates an exemplary charge pump according to embodiments.

An example of one of the charge pumps 400 is shown in FIG. 4B. As shown, the charge pump 400 includes current source 402 and current source 404 and output stage (cascade current mirror) 406. The current sources 402, 404 receive bias voltage Bp from the bias generator 352 (FIG. 4A) and the signals UPB and DNB, the up and down outputs from the phase detector 202.

Figure 5:
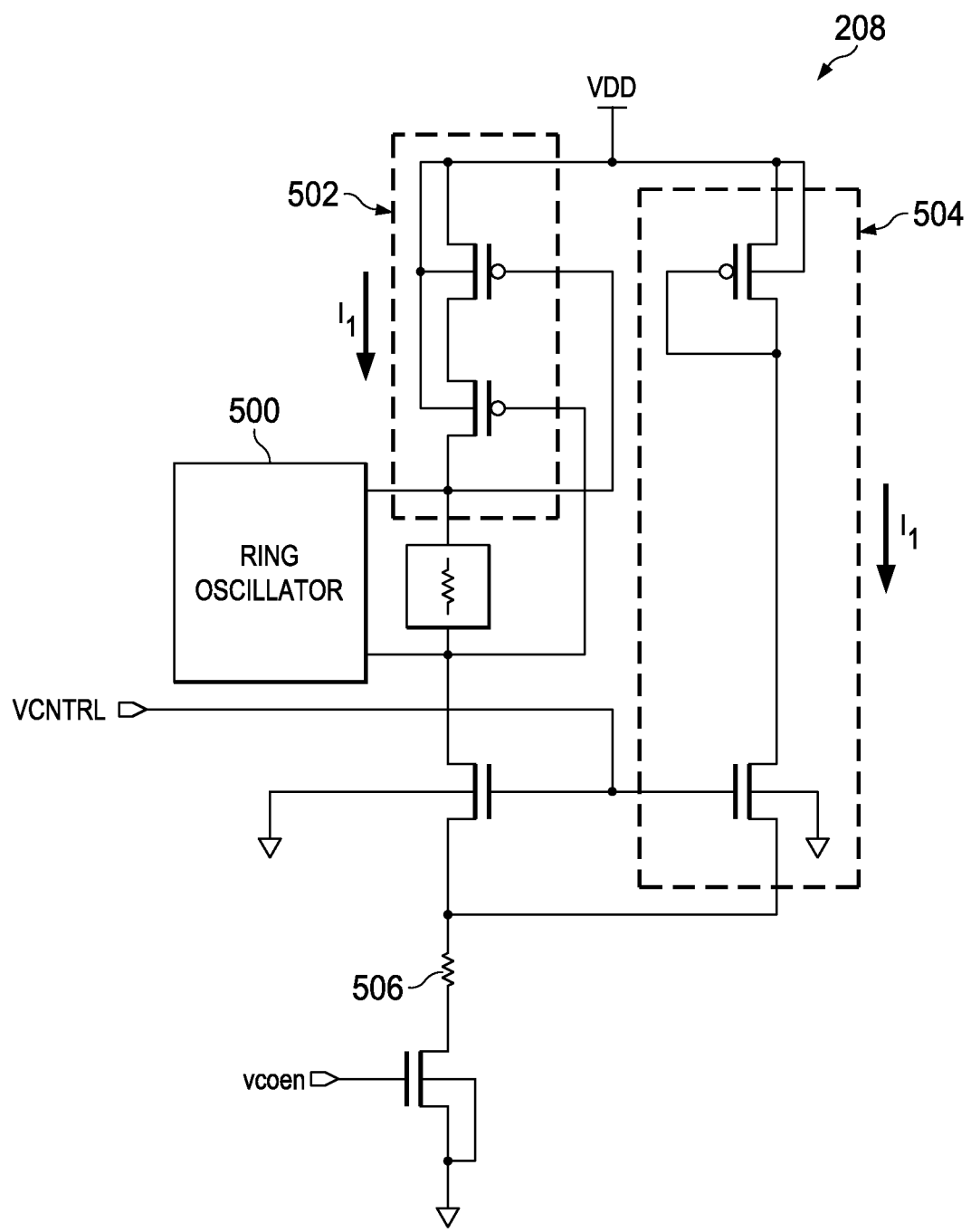
FIG. 5 illustrates an exemplary VCO according to embodiments.

An example of current starved VCO circuitry 208 is shown in FIG. 5. This bias scheme generates current in nA with optimal resistor on chip. The voltage Vcntrl is provided as a common mode input voltage. Here, a source degeneration technique is used to bias the delay cell of ring oscillator 500. To reduce the area of the resistor, a current source 504 is added. Vcntrl is fed as a common mode voltage to both current sources 502 and 504. Pumping double current 211 to the resistor 506 effectively scales down the value of the resistor by half.

Shown is a current source 502 providing a current I1 through resistor 206. A second current source 504 pumps a similar current I1 through the resistor 506. In this way, the resistor 506 may have a value that is reduced compared to a similar circuit without the current source 504. In some embodiments, the resistor 506 has a value of ½ of a circuit without the current source 504. The voltage Vcntrl is provided as a common mode input voltage to VCO bias circuitry.

Figure 6:
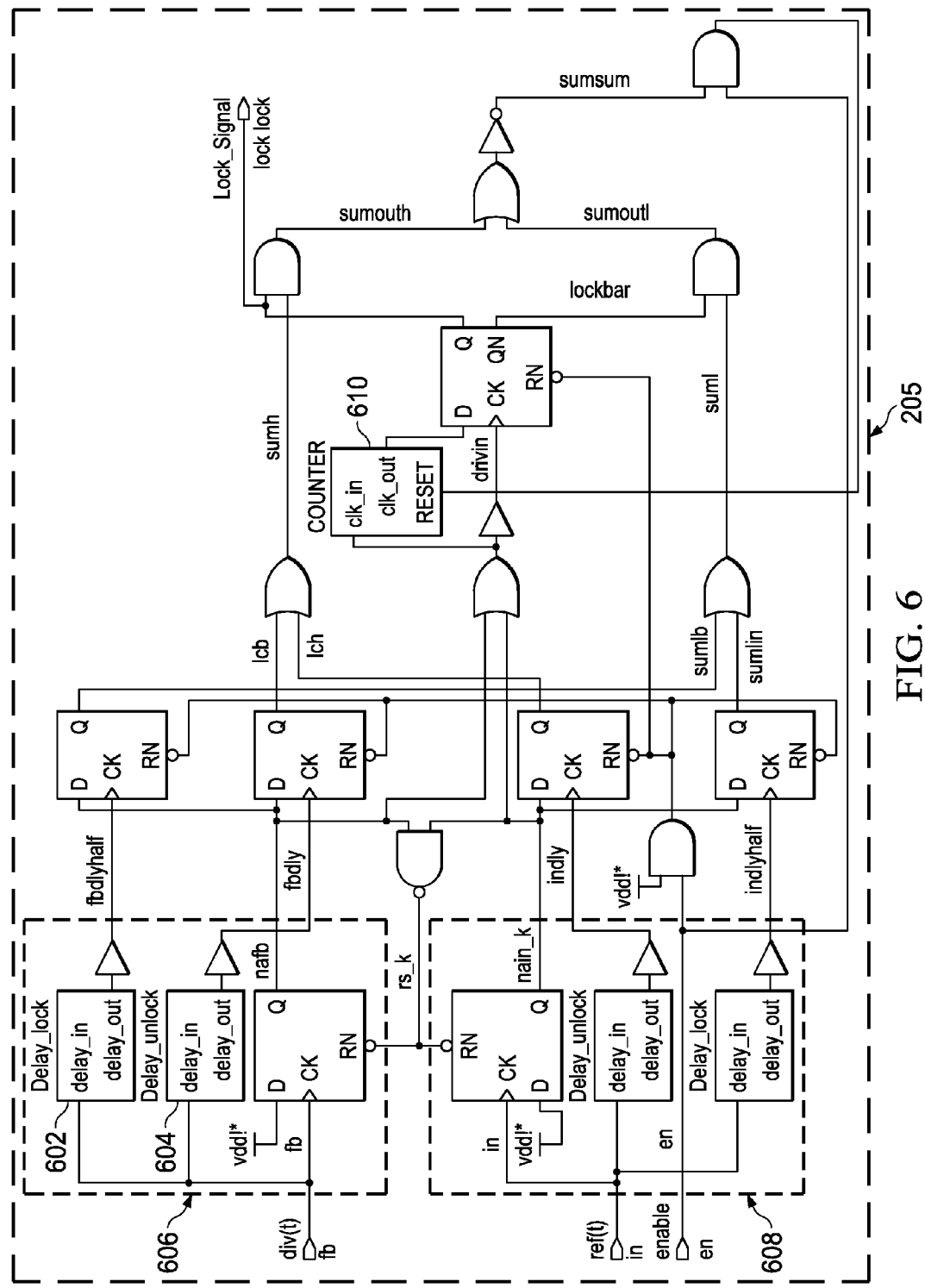
FIG. 6 illustrates an exemplary PLL Lock Detector according to embodiments.

An example Lock Detector circuitry 205 is shown in FIG. 6. The Lock Detector 205 monitors the output of the PLL continuously so that false signal generation from the PLL can be avoided. Depending upon the phase error between ref(t) and div(t), an lock/unlock window for generation of a lock signal can be predefined. The delay cell circuit 602 used to measure the phase error window comprises a bias and delay cell replica of the VCO 208. Any change in VCO 208 frequency will be replicated in the delay cell of lock circuit 205, making a precise lock generation signal for PLL.

Circuitry 606 works by measuring the phase error between div(t) and ref(t) inputs and using a window of Delay_lock 602 (45 ns in some embodiments) phase error to decide the lock status of the PLL. Circuitry 608 works by measuring phase error between ref(t) and div(t) inputs. Circuitry 606 and 608 together capture the absolute phase error between ref(t) and div(t). If the counter 610 counts 8 or more consecutive cycles inside the window of Delay_lock 602, it will consider PLL to be locked and output Lock_Signal logic high. When phase error drift is outside window of Delay_unlock 604 (90 ns in this case) on any subsequent cycle, it will consider the PLL out of lock and output Lock_Signal logic low.

Although the invention has been described with respect to specific embodiments thereof, these embodiments are merely illustrative, and not restrictive of the invention. The description herein of illustrated embodiments of the invention, including the description in the Abstract and Summary, is not intended to be exhaustive or to limit the invention to the precise forms disclosed herein (and in particular, the inclusion of any particular embodiment, feature or function within the Abstract or Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the claims that follow, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the claims that follow, the meaning of "in" includes "in" and "on" unless the context clearly dictates otherwise.

It will be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted.

What is claimed is:

1. An integrated circuit, comprising:
   a phase detector;
   a first charge pump and a second charge pump coupled to the phase detector, and configured to receive inputs from the phase detector, the first charge pump outputting a low current and the second charge pump outputting a high current, wherein the first charge pump and the second charge pump have synchronized outputs with respect to the inputs received from the phase detector; and
   a dual input loop filter coupled to the first charge pump and the second charge pump and comprising a first input receiving the low current and a second input receiving the high current and an output providing for an output voltage.

2. An integrated circuit in accordance with claim 1, wherein the dual input loop filter includes a first capacitance coupled in parallel at a node with a series-coupled second capacitance and a resistor, the low current output of the first charge pump being coupled with the node and the high current output of the second charge pump being coupled between the second capacitance and the resistor.

3. An integrated circuit in accordance with claim 2, further comprising a common bias circuitry for charging the first charge pump and the second charge pump.

4. An integrated circuit in accordance with claim 1, further comprising a common bias circuitry for charging the first charge pump and second charge pump.

5. An integrated circuit in accordance with claim 3, wherein each of the first and second charge pumps is a current steering amplifier charge pump which can be implemented using low current.

6. An integrated circuit in accordance with claim 1, wherein the high current is K times the low current, wherein K is a predetermined value.

7. An integrated circuit in accordance with claim 2, wherein the second capacitance is approximately a tenth of an actual desired capacitance for stable negative feedback loop.

8. An integrated circuit in accordance with claim 3, further including a voltage control oscillator (VCO) coupled to the dual input loop filter.

9. An integrated circuit in accordance with claim 8, wherein the low frequency VCO includes a bias block capable of generating current in nA.

10. An integrated circuit in accordance with claim 9, wherein the bias block implements a source degeneration for do voltage to current transformation.

11. An integrated circuit in accordance with claim 10, wherein a resistor value for the source degeneration is scaled down by half factor.

12. An integrated circuit in accordance with claim 11, wherein a common mode voltage technique is used to scale down the value of the resistor.

13. An integrated circuit in accordance with claim 12, further comprising a current source branch which is a replica of existing bias circuitry.

14. A phase locked loop circuit, comprising:
   a phase detector;
   a first charge pump and a second charge pump coupled to the phase detector, and configured to receive inputs from the phase detector, the first charge pump outputting a low current and the second charge pump outputting a high current, wherein the first charge pump and the second charge pump have synchronized outputs with respect to the inputs received from the phase detector;
   a dual input loop filter coupled to the first charge pump and the second charge pump and comprising a first input receiving the low current and a second input receiving the high current and an output providing for an output voltage; and:
   a lock detector configured to continuously monitor an output of the phase locked loop circuit.

15. A phase locked loop circuit in accordance with claim 14, the lock detector configured to generate a lock signal depending upon phase error between a reference clock and a feedback clock signal.

16. A phase locked loop circuit in accordance with claim 15, the lock detector having a delay cell to predefine a lock/unlock window for the lock signal.

17. A phase locked loop circuit in accordance with claim 16, wherein the delay cell includes a bias circuit and delay cell replica of an associated VCO, such that a change in VCO frequency will be replicated in the delay cell of the lock detector circuit.

18. An integrated circuit, comprising:
   a phase detector;
   a first capacitor coupled in series with a resistor between a first node and ground;
   a second capacitor coupled between the first node and ground;
   a first charge pump coupled with the phase detector and configured to receive inputs from the phase detector and generating a first current which is fed to a second node between the first capacitor and the resistor, wherein the first charge pump and the second charge pump have synchronized outputs with respect to the inputs received from the phase detector;

a second charge pump coupled with the phase detector and configured to receive inputs from the phase detector and generating a second current which is fed to the first node, wherein the first current is higher than the second current; and wherein an output voltage is available at the first node.

19. An integrated circuit in accordance with claim 1, further comprising a voltage controlled oscillator receiving said output voltage.

20. An integrated circuit in accordance with claim 19, further comprising a lock detector configured to continuously monitor an output of the phase locked loop circuit, wherein the lock detector is configured to generate a lock signal depending upon phase error between a reference clock and a feedback clock signal.

* * * * *

UNITED STATES PATENT AND TRADEMARK OFFICE
CERTIFICATE OF CORRECTION

PATENT NO. : 9,467,154 B2  Page 1 of 1
APPLICATION NO. : 14/594447
DATED : October 11, 2016
INVENTOR(S) : Himanshu Saxena It is certified that error appears in the above-identified patent and that said Letters Patent is hereby corrected as shown below:

IN THE SPECIFICATION

Column 2,
Line 25, "...In some embodiments, the low frequency VOC includes a bias block'..."---Change to---
"...In some embodiments, the low frequency VCO includes a bias block'..."

Signed and Sealed this
Twenty-ninth Day of November, 2016

Michelle K. Lee
*Director of the United States Patent and Trademark Office*